(12) United States Patent
Amasuga et al.

(10) Patent No.: US 7,557,389 B2
(45) Date of Patent: Jul. 7, 2009

(54) FIELD-EFFECT TRANSISTOR

(75) Inventors: Hirotaka Amasuga, Tokyo (JP); Tetsuo Kunii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 136 days.

(21) Appl. No.: 11/557,551

(22) Filed: Nov. 8, 2006

(65) Prior Publication Data
US 2007/0267652 A1  Nov. 22, 2007

(30) Foreign Application Priority Data
May 22, 2006  (JP) .............................. 2006-141257

(51) Int. Cl.
*H01L 29/778* (2006.01)
(52) U.S. Cl. ................................ 257/194; 257/E29.246
(58) Field of Classification Search .................. 257/194
See application file for complete search history.

(56) References Cited

U.S. PATENT DOCUMENTS

| | | | |
|---|---|---|---|
| 5,043,777 A * | 8/1991 | Sriram ........................ | 257/194 |
| 5,641,977 A * | 6/1997 | Kanamori .................... | 257/192 |
| 6,271,547 B1 * | 8/2001 | Hoke et al. .................. | 257/192 |
| 6,274,893 B1 * | 8/2001 | Igarashi et al. .............. | 257/192 |

2002/0074563 A1  6/2002  Bito et al.

FOREIGN PATENT DOCUMENTS

| | | |
|---|---|---|
| EP | 0 833 379 A2 | 4/1998 |
| JP | 04-103136 A | 4/1992 |
| JP | 11-251575 A | 9/1999 |
| JP | 2001-185558 A | 7/2001 |

OTHER PUBLICATIONS

Amasuga et al., "A High Power Density TaN/Au T-gate pHEMT with High Humidity Resistance for Ka-Band Applications", IEEE MTT-S International Microwave Symposium Digest, pp. 831-834, (2005).

* cited by examiner

*Primary Examiner*—Jerome Jackson, Jr.
(74) *Attorney, Agent, or Firm*—Leydig, Voit & Mayer, Ltd.

(57) ABSTRACT

A field-effect transistor includes a channel layer formed of a III-V compound semiconductor excluding aluminum; a gate contact layer formed of a III-V compound semiconductor and provided on the channel layer, the III-V compound semiconductor having a dopant concentration equal to or less than $1 \times 10^{16}$ cm$^{-3}$, containing aluminum, and having a large band gap energy; a gate buried layer of a III-V compound semiconductor and provided on the gate contact layer; and a gate electrode buried in the gate buried layer and in contact with the gate contact layer. A recess in the gate buried layer is opposed to an upper side wall of the gate electrode with a gap therebetween and a part of the gate buried layer, and where a contact with a lower side wall of the gate electrode is established, part of the gate buried layer remains without being removed.

7 Claims, 2 Drawing Sheets

FIELD-EFFECT TRANSISTOR

BACKGROUND OF THE INVENTION

1. Field of the Invention

The present invention generally relates to a field-effect transistor using a compound semiconductor, which is suited to be used in a high frequency band of equal to or more than 800 MHz.

2. Description of the Related Art

A field-effect transistor using a compound semiconductor is generally used for a transmission/reception portion for a high speed/high capacity wireless communication system to amplify a high frequency signal of equal to or more than 800 MHz or to perform switching. An important characteristic required for a high frequency amplifier is a high output characteristic. In order to realize the high output in the high frequency band, it is effective to increase a maximum drain current or attain a high breakdown voltage.

In general, an increase in a doped concentration for increasing the maximum drain current reduces the breakdown voltage. That is, the increase in the maximum drain current and the increase in the breakdown voltage have a trade-off relationship. In view of this, attempts are being made to attain the increase in the maximum drain current and the breakdown voltage both by developing a structure of a transistor.

As an example, in order to increase the breakdown voltage, there is widely used a method of increasing a band gap energy of a semiconductor layer (hereinafter, referred to as "gate contact layer") which is in Schottky junction with a gate to increase a potential barrier at an interface between a metal and a semiconductor. In a III-V compound semiconductor, aluminum (hereinafter, referred to as "Al") is added to increase the band gap energy in many cases. For example, in a semiconductor layer mainly containing gallium arsenide (hereinafter, referred to as "GaAs"), an AlGaAs layer is widely used because a lattice matching with GaAs is obtained regardless of an Al composition.

In recent years, a semiconductor layer which mainly contains gallium nitride (hereinafter, referred to as "GaN") is considered to allow the high breakdown voltage and the high output and is therefore being developed. The semiconductor layer which mainly contains GaN uses an AlGaN layer as a gate contact layer in many cases.

However, a use of AlGaAs or AlGaN as the gate contact layer has a problem of reducing the maximum drain current due to an expansion of a surface depletion layer. A surface of the compound semiconductor generally serves as an interface with a protective insulating film, although the surface has high defect levels, which causes a Fermi level pinning or a transient response of a charge capture/release through the level. As a result, the surface depletion layer is expanded in a case of a direct current or in a frequency band of equal to or more than 1 MHz, which reduces the maximum drain current.

In a GaAs-based transistor, GaAs has a surface level density 10 to 100 times that of silicon. AlGaAs has high defect levels such as a DX center even in a bulk thereof and Al is likely to be oxidized on a surface thereof, so a density of electrons to be captured is significantly larger than that on a surface of the GaAs. Thus, the surface depletion layer is expanded to cause reduction in the maximum drain current. The same phenomenon occurs in a GaN-based transistor.

In view of the above, there has been proposed a field-effect transistor having a structure provided with an unexposed AlGaAs or AlGaN layer, an example of which is a field-effect transistor having a buried gate structure. The field-effect transistor having the buried gate structure includes a buffer layer, a channel layer, a gate contact layer, and a gate electrode. The buffer layer formed of GaAs is provided on a GaAs substrate, the channel layer formed of GaAs is provided on the buffer layer, and the gate contact layer formed of AlGaAS is provided on the channel layer. The gate electrode formed on the gate contact layer is in Schottky junction therewith. A gate buried layer formed of GaAs is provided between a cap layer for ohmic contact, which is formed of n-GaAs, and the gate contact layer. A gate is buried in the gate buried layer and in Schottky junction with the gate contact layer. In general, in order to reduce a resistance of an ohmic region, the gate buried layer and the gate contact layer are each an n-type doping layer. An employment of the buried gate structure increases the maximum drain current (see, for example, JP 2001-185558 A and JP 11-251575 A).

Herein, transistors each having a conventional structure, in which the gate contact layer was exposed, and the buried gate structure were prepared and evaluated with respect to characteristics of two-terminal (i.e., a gate and a drain) breakdown voltage. When a voltage Vdg applied between the gate and the drain was 1 V, 10 V, or 20 V, a gate leakage current Igd (A/mm) in the conventional structure was $-3\times10^{-8}$, $-1.5\times10^{-6}$, or $-2\times10^{-2}$, respectively, while that in the buried gate structure was $-1.5\times10^{-8}$, $-5\times10^{-4}$, or $-7\times10^{-2}$, respectively. Further, the breakdown voltage in the conventional structure was 21 V, while that in the buried gate structure was 31 V. As described above, the buried gate structure has a breakdown voltage higher than that of the structure in which a gate is not buried. However, when the transistor is normally operated, that is, when the voltage applied between the gate and the drain is 10 V or 20 V, the buried gate structure has a problem in that the gate leakage current is increased. This is because a side wall of the gate made of metal is in contact with the buried layer to make a leakage path large. As described above, there is a problem in that a large gate leakage current causes a large gate current to flow in a case of a high frequency operation, which results in a reduction in gate voltage.

In addition, a breakdown voltage leakage current characteristic (i.e., a Vdg value at the time of Igd=0.1 mA/mm) and a drain current (Vd=2V) are determined when a buried layer thickness is changed. The gate leakage current greatly depends on the buried layer thickness. That is, the smaller the buried layer thickness is, the more the leakage current reduces. Note that in a case where the buried layer thickness is small, a distance between a surface and a channel layer where the drain current flows is made short. As a result, the surface depletion layer induces the reduction in the maximum drain current. Therefore, it is difficult for the conventionally proposed buried gate structure to increase the maximum drain current and attain the high breakdown voltage at the same time.

SUMMARY OF THE INVENTION

The present invention has an object to provide a field-effect transistor, which attains a high breakdown voltage and a high output while adopting a buried gate structure effective for increasing a maximum drain current.

The field-effect transistor according to the present invention is characterized in that the field-effect transistor includes at least: a semi-insulating substrate; a channel layer which is formed of an epitaxial layer including a III-V compound semiconductor excluding aluminum and provided on the semi-insulating substrate; a gate contact layer which is formed of the epitaxial layer and provided on the channel layer, in which the epitaxial layer including a III-V compound semiconductor which contains aluminum and has a large band gap energy and having a doped concentration of equal to or less than $1\times10^{16}$ cm$^{-3}$; a gate buried layer which is formed of the epitaxial layer and provided on the gate contact layer, the epitaxial layer including the III-V compound semiconductor excluding aluminum and having the doped concentration of equal to or less than $1\times10^{16}$ cm$^{-3}$; and a gate electrode which is buried in the gate buried layer and is in contact with the gate contact layer, and in that a recess is formed in the gate buried layer so that the recess is opposed to an upper side wall of the gate electrode with a gap therebetween and a part of the gate buried layer, where a contact with a lower side wall of the gate electrode is established, remains without being etched.

The field-effect transistor according to the present invention produces the following effects. That is, only a lower side wall of the gate electrode buried in the gate buried layer is in contact with the gate buried layer, which suppresses a gate leakage current. Further, a surface level of the gate buried layer affects the maximum drain current only by a recess width, that is, by a distance between an upper side wall of the gate electrode and an inner side wall of a recess provided in the gate buried layer. This can suppress a reduction in the maximum drain current to be small.

In addition, the gate buried layer and the gate contact layer are undoped and have a doped concentration of equal to or less than $1\times10^{16}$ cm$^{-3}$, which can make a leakage path small and suppress the gate leakage current.

DETAILED DESCRIPTION OF THE PREFERRED EMBODIMENTS

First Embodiment

Figure 1:
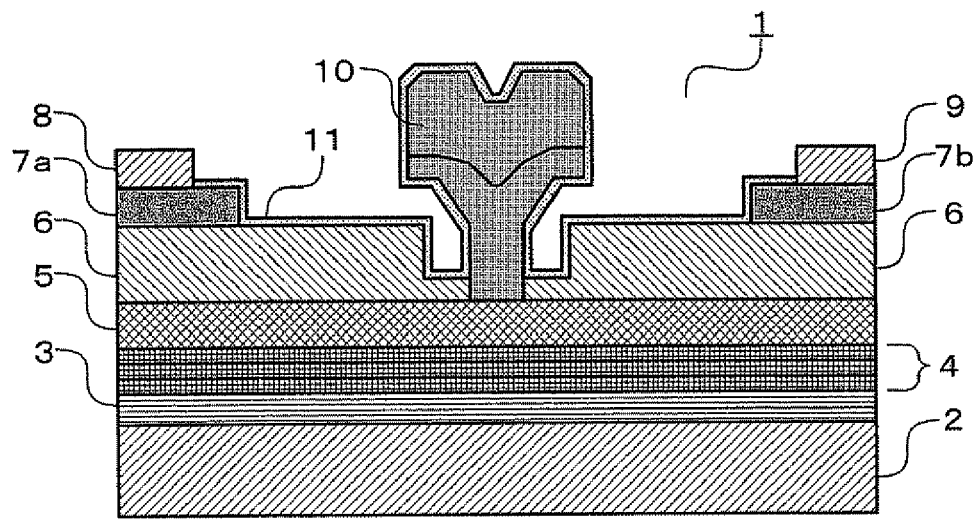
FIG. 1 is a sectional view of a field-effect transistor according to a first embodiment of the present invention.
Figure 2:
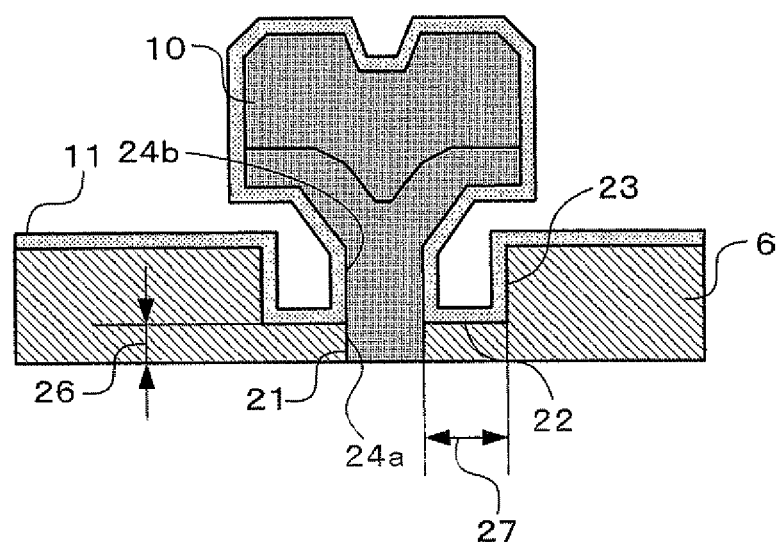
FIG. 2 is an enlarged sectional view of a periphery of a gate electrode of FIG. 1.

FIG. 1 is a sectional view of a field-effect transistor according to a first embodiment of the present invention. FIG. 2 is an enlarged sectional view of a periphery of a gate electrode.

A compound semiconductor according to the present invention corresponds to a III-V compound semiconductor. In addition to GaAs and GaN, gallium phosphide (GaP), gallium antimonide (GaSb), indium nitride (InN), and indium phosphide (InP) can also be used as the compound semiconductor. Further, as a semi-insulating substrate, a substrate composed of the GaAs or InP can be used.

Hereinafter, description will be made using the GaAs as an example of the III-V compound semiconductor.

As shown in FIG. 1, a field-effect transistor 1 according to a first embodiment of the present invention includes a buffer layer 3, a channel layer 4, a gate contact layer 5, and a gate buried layer 6. The buffer layer 3 is formed of an undoped GaAs epitaxial layer grown on a semi-insulating GaAs substrate 2 serving as the semi-insulating substrate. The channel layer 4 is formed of an undoped GaAs epitaxial layer grown on the buffer layer 3. The gate contact layer 5 is formed of an undoped AlGaAs epitaxial layer grown on the channel layer 4. The gate buried layer 6 is formed of an undoped GaAs epitaxial layer grown on the gate contact layer 5.

The undoped AlGaAs epitaxial layer is an intrinsic semiconductor in which a doped concentration of an n-type dopant is equal to or lower than $1\times10^{16}$ cm$^{-3}$.

Each of the undoped GaAs epitaxial layers is the intrinsic semiconductor in which the doped concentration of the n-type dopant is equal to or lower than $1\times10^{16}$ cm$^{-3}$.

The field-effect transistor 1 according to the first embodiment further includes two cap layers 7a and 7b, a source electrode 8, a drain electrode 9, a gate electrode 10 and a passivation layer 11. The cap layers 7a and 7b are formed of n+-type GaAs epitaxial layers grown on the gate buried layer 6, patterned, and separated by a predetermined distance from each other. The source electrode 8 is formed on the cap layer 7a. The drain electrode 9 is formed on the cap layer 7b. The gate electrode 10 controls a current flowing into the channel layer 4 between the source electrode 8 and the drain electrode 9, and a part of the gate electrode 10 is buried into the gate buried layer 6. The passivation layer 11 covers a surface excluding the source electrode 8 and drain electrode 9.

As shown in FIG. 2, the gate buried layer 6 is provided with a through hole 21 and a recess 23. A bottom end of the through hole 21 is exposed to the gate contact layer 5. The recess 23 encloses the through hole 21, has a section larger than that of the through hole 21, and includes a bottom portion 22 so that a part of the gate buried layer 6 exists between the bottom portion 22 and the gate contact layer 5.

In the gate electrode 10, a bottom face thereof is in contact with the gate contact layer 5, a lower side wall 24a is in contact with an inner wall of the through hole 21, and an upper side wall 24b is opposed to an inner wall of the recess 23 while intervening a gap.

Note that a thickness of the gate buried layer 6 with which the lower side wall 24a of the gate electrode 10 is in contact refers to a "recess region buried layer thickness" 26, hereinafter. Further, the gap between the upper side wall 24b of the gate electrode 10 and the inner side wall of the recess 23 opposed to each other refers to a "recess width" 27, hereinafter.

In the field-effect transistor 1 according to the first embodiment, the recess region buried layer thickness 26 is more than 0 nm and equal to or less than 50 nm, and the recess width 27 is more than 0 μm and equal to or less than 0.5 μm.

Next, a suitable range of the recess region buried layer thickness 26 will be described.

As described in the background of the invention section, a gate leakage current greatly depends on a buried layer thickness. The gate leakage current becomes smaller as the buried layer thickness reduces. To be specific, when the buried layer thickness was, for example, 20 nm, 40 nm, 50 nm, or 100 nm, a drain-gate voltage Vdg in a case where the gate leakage current Igd was 0.1 mA/mm was 22 V, 13 V, 10 V, or 6 V, respectively. The drain-gate voltage Vdg requires at least twice an operation voltage of 5 V, so the buried layer thickness is preferably equal to or less than 50 nm, thus allowing to attain the gate leakage current Igd of equal to or less than 0.1 mA/mm in a case where the drain-gate voltage is 10 V. This is also applied to the recess region buried layer thickness 26, so the recess region buried layer thickness 26 is preferably equal to or less than 50 nm.

In addition, when the recess region buried layer thickness 26 is set to 0 nm to expose the gate contact layer 5, a density of electrons to be captured is significantly increased because Al is likely to be oxidized on a surface of the AlGaAs forming the gate contact layer 5, which causes an expansion of a surface depletion layer and a reduction of a maximum drain current. Therefore, in consideration of a process margin, the recess region buried layer thickness 26 is preferably more than 10 nm so that the AlGaAs is not exposed.

Next, a suitable range of the recess width 27 will be described.

In each of first, second, third, and fourth examples, a field-effect transistor, which was the same as that of the first embodiment except that the recess 23 had the recess width 27 of 0.4 µm, 0.5 µm, 0.6 µm, or 1.0 µm, was produced and evaluated with respect to a pulse drain current characteristic. The pulse drain current characteristic was represented by a percentage obtained as follows. A gate voltage having a frequency of 1 MHz was applied to the gate electrode 10 and a source/drain voltage of 2 V was applied between the source electrode 8 and the drain electrode 9, thereby obtaining a pulse drain current value. Further, a DC gate voltage was applied to the gate electrode 10 and a source/drain voltage of 2 V was applied between the source electrode 8 and the drain electrode 9, thereby obtaining a DC drain current value. Then, a maximum value of the pulse drain current was compared to the DC drain current value.

In a case where the recess width 27 was 0.4 µm, 0.5 µm, 0.6 µm, or 1.0 µm, the pulse drain current characteristic was 86%, 80%, 73%, or 65%, respectively. As mentioned above, as the recess width 27 is increased, the pulse drain current characteristic is reduced. This is because the pulse drain current characteristic is greatly affected depending on whether a surface level is high or low, as compared with the DC drain current. This is also because, as the recess width 27 becomes large, the surface level is increased. The recess width 27 is preferably set to equal to or less than 0.5 µm because the pulse drain current characteristic is generally required to be equal to or more than 80%.

In order that the inner wall of the recess 23 is not in contact with the side wall of the gate electrode 10, the recess width 27 is required to be more than 0 µm.

Further, in some cases, a field-effect transistor formed of a compound semiconductor, which is used as a high output amplifier operating in a high frequency band, specifically, in K band or higher, has the gate electrode 10 and the cap layer 7b on the drain electrode 9 side which are separated by approximately 0.5 µm at minimum. The field-effect transistor can also be provided with the recess 23.

The field-effect transistor 1 according to the first embodiment and a field-effect transistor of a first comparative example which is the same as that according to the first embodiment except the gate buried layer 6 in which the doped concentration of the n-type dopant is $5\times10^{16}$ cm$^{-3}$ were produced and a breakdown voltage leakage current characteristic was obtained.

The breakdown voltage leakage current characteristic is obtained by measuring the drain-gate voltage Vdg applied between the drain electrode 9 and the gate electrode 10 when the gate leakage current Igd flowing through the gate electrode 10 and the drain electrode 9 is 0.1 mA/mm.

In the field-effect transistor 1 according to the first embodiment, the drain-gate voltage Vdg was 28 V when the gate leakage current Igd was 0.1 mA/mm. On the other hand, in the field-effect transistor of the first comparative example, the drain-gate voltage Vdg was 10 V when the gate leakage current Igd was 0.1 mA/mm. As described above, the gate leakage current of the field-effect transistor 1 according to the first embodiment is greatly suppressed. This is because the doped concentration of the n-type dopant in each of the gate buried layer 6 and the gate contact layer 5 is equal to or less than $1\times10^{16}$ cm$^{-3}$, regions of the gate buried layer 6 and the gate contact layer 5 which are in contact with the gate electrode 10 are likely to be depleted, and a leakage path in a reverse direction is made smaller. Accordingly, the gate leakage current flowing from the gate electrode 10 into the drain electrode 9 is suppressed.

In the field-effect transistor 1 as described above, only the lower side wall 24a of the gate electrode 10 which is buried in the gate buried layer 6 is in contact with the gate buried layer 6, so the gate leakage current is suppressed and the surface level of the gate buried layer 6 only by the recess width 27 affects the maximum drain current. Therefore, reduction in maximum drain current can be suppressed.

In addition, the gate buried layer 6 and the gate contact layer 5 are undoped and each have the doped concentration of equal to or less than $1\times10^{16}$ cm$^{-3}$, so the leakage path is made smaller and the gate leakage current can be suppressed.

Second Embodiment

Figure 3:
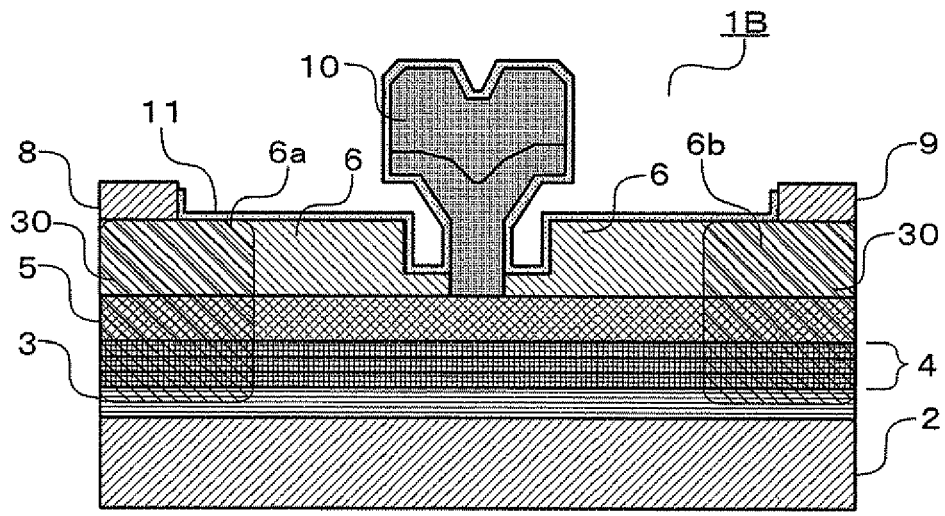
FIG. 3 is a sectional view of a field-effect transistor according to a second embodiment of the present invention.

FIG. 3 is a sectional view of a field-effect transistor according to a second embodiment of the present invention.

A field-effect transistor 1B according to the second embodiment of the present invention is different from the field-effect transistor 1 according to the first embodiment in that the field-effect transistor 1B includes injection/anneal regions 30 in parts of a gate buried layer 6, a gate contact layer 5, and a channel layer 4 and does not include cap layers 7a and 7b. The other components of the field-effect transistor 1B are the same as those of the field-effect transistor 7 of the first embodiment, so the same components are denoted by the same reference numerals and the description thereof will be omitted.

As shown in FIG. 3, in the field-effect transistor 1B according to the second embodiment, regions 6a and 6b in the gate buried layer 6 and the injection/anneal regions 30 are formed. On the regions 6a and 6b, a source electrode 8 and a drain electrode 9 are formed, respectively. The injection/anneal regions 30 are formed in regions where the regions 6a and 6b in the gate buried layer 6, the gate contact layer 5, and the channel layer 4 are superimposed on one another.

The injection/anneal regions 30 into which silicon is injected first as an n-type dopant are then subjected to activation anneal, thereby forming ohmic junction with the source electrode 8 and the drain electrode 9.

As described above, the silicon is injected into the regions 6a and 6b of the gate buried layer 6, on which the source electrode 8 and the drain electrode 9 are formed, respectively, then, the activation anneal and the ohmic junction between the source electrode 8 and the channel layer 4 and between the drain electrode 9 and the channel layer 4 are performed. Therefore, a resistance is not increased, but rather reduced. In particular, an increase in source resistance which causes a reduction in gain can be prevented.

Also, the injection/anneal regions 30 are provided in the gate contact layer 5, which can prevent an increase in resistance.

As described above, the gate buried layer 6 is formed of an undoped GaAs epitaxial layer and the gate contact layer 5 is formed of an undoped AlGaAs epitaxial layer, which can produce an effect of suppressing a gate leakage current and can prevent the increase in resistance.

Note that a component of the n-type dopant is not limited to silicon.

In addition, the provision of the injection/anneal regions 30 in the gate buried layer 6 can omit the cap layers 7a and 7b, which can simplify a process of forming the epitaxial layers and reduce a cost.

Note that a process of forming the silicon injection process and the ohmic layer forming process are added but an etching process of the cap layers 7a and 7b can be omitted, so the number of wafer processes is substantially the same.

In general, electric field concentration is likely to occur at a corner of the recess. In a region where the electric field concentration occurs, a polarized molecule such as water or an ion tends to concentrate, which easily leads to reaction or corrosion. Further, when a region having a square shape is highly doped, reaction is promoted compared with a case of an undoped region because sufficient electrons for reaction exist and the electric field concentration is likely to occur.

In the second embodiment, only the undoped region in the gate buried layer 6 corresponds to a region having the corner of the recess, which can improve moisture resistance of the surface.

Third Embodiment

Figure 4:
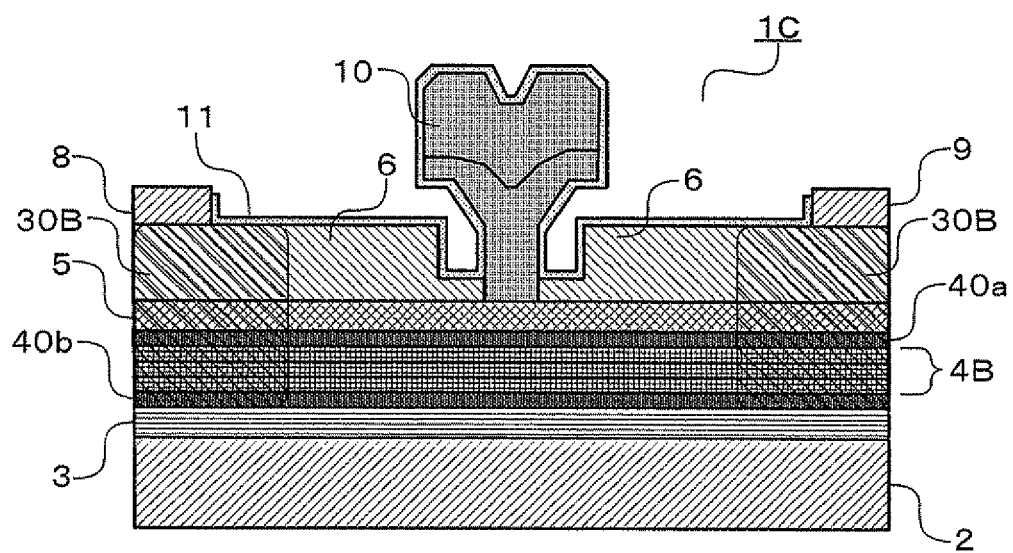
FIG. 4 is a sectional view of a field-effect transistor according to a third embodiment of the present invention.

FIG. 4 is a sectional view of a field-effect transistor according to a third embodiment of the present invention.

A field-effect transistor 1C according to the third embodiment of the present invention is different from the field-effect transistor 1B according to the second embodiment in that the field-effect transistor 1C includes electron supply layers 40a and 40b and a channel layer 4B instead of the channel layer 4. The other components of the field-effect transistor 1C are the same as those of the field-effect transistor 1B of the second embodiment, so the same components are denoted by the same reference numerals and the description thereof will be omitted.

As shown in FIG. 4, the field-effect transistor 1C according to the third embodiment is a high electron mobility field-effect transistor (HEMT). The channel layer 4B is formed of an undoped InGaAs epitaxial layer in which conduction electrons move. Further, the field-effect transistor 1C according to the third embodiment additionally includes electron supply layers 40a and 40b, formed by doping a dopant, which form conduction electrons spatially separated from the channel layer 4B.

An injection/anneal region 30B according to the third embodiment is formed by injecting silicon and performing an activation anneal with a rapid annealing technique, for example, a rapid thermal annealing technique. Note that the injection/anneal region may be applied to the field-effect transistor according to the first or second embodiment.

As described above, the injection/anneal region 30B is formed with the rapid annealing technique, so epitaxial layers thinner than those of the field-effect transistor 1B according to the second embodiment are laminated. Thus, the injection/anneal region 30B may be formed in the high electron mobility field-effect transistor, in which a width of the epitaxial layer itself changes during dopant activation anneal.

What is claimed is:

1. A field-effect transistor, comprising:
a semi-insulating substrate;
an epitaxial channel layer of a III-V compound semiconductor material free of aluminum and supported by the semi-insulating substrate;
an epitaxial gate contact layer, on and in contact with the channel layer, of a III-V compound semiconductor material which contains aluminum and has a dopant concentration not exceeding $1\times10^{16}$ cm$^{-3}$;
an epitaxial gate buried layer, located on and in contact with the gate contact layer, consisting of the III-V compound semiconductor material free of aluminum of the channel layer, having a thickness, and having a dopant concentration not exceeding $1\times10^{16}$ cm$^{-3}$, wherein
the gate buried layer includes a recess entirely within the gate buried layer and extending only partially through the thickness of the gate buried layer, the recess including a bottom wall that is transverse to the thickness of the gate buried layer, and first side walls that are transverse to and join the bottom wall and that extend into the recess toward the gate contact layer, and
a hole centrally located in the recess, extending from the bottom wall to and exposing a portion of the gate contact layer and including second side walls that are transverse to the bottom wall; and
a gate electrode including
a leg having a first portion in contact with the gate contact layer, filling the hole, and having a lower side wall in contact with the second side walls, and a second portion within the recess and having upper side walls spaced from the first side walls of the recess, and
an upper portion, on the leg, spaced from the gate buried layer, and having a gate length longer than the leg and longer that the total width of the recess along the bottom wall between the first side walls.

2. The field-effect transistor according to claim 1 wherein the second side walls extend from the gate contact layer by a distance of not more than 50 nm.

3. The field-effect transistor according to claim 1 wherein the recess has first widths along the bottom wall between the first side wall of the recess and the upper side wall of the gate electrode of not more than 500 nm.

4. The field-effect transistor according to claim 1 further comprising a source electrode and a drain electrode in electrical contact with respective regions of the gate buried layer on opposite sides of the recess.

5. The field-effect transistor according to claim 4 wherein regions of the channel layer, the gate contact layer, and the gate buried layer directly opposite the source electrode and the drain electrode are implanted with donor ions.

6. The field-effect transistor according to claim 5, wherein the field-effect transistor is a high electron mobility field-effect transistor.

7. The field-effect transistor according to claim 1, wherein the gate electrode is in Schottky contact with the gate contact layer.

* * * * *